US008267698B2

(12) United States Patent
Ishikawa et al.

(10) Patent No.: US 8,267,698 B2
(45) Date of Patent: Sep. 18, 2012

(54) CONNECTOR UNIT WITH A CLICKING FEELING

(75) Inventors: Tetsuya Ishikawa, Tokyo (JP); Hiroaki Obikane, Tokyo (JP); Yasufumi Yahiro, Tokyo (JP)

(73) Assignee: Japan Aviation Electronics Industry Limited, Tokyo (JP)

( * ) Notice: Subject to any disclaimer, the term of this patent is extended or adjusted under 35 U.S.C. 154(b) by 114 days.

(21) Appl. No.: 12/763,352

(22) Filed: Apr. 20, 2010

(65) Prior Publication Data

US 2010/0267287 A1 Oct. 21, 2010

(30) Foreign Application Priority Data

Apr. 21, 2009 (JP) ................................ 2009-103193

(51) Int. Cl.
*H01R 12/00* (2006.01)
*H05K 1/00* (2006.01)

(52) U.S. Cl. ........................................................ 439/17

(58) Field of Classification Search .................... 439/74, 439/700

See application file for complete search history.

(56) References Cited

U.S. PATENT DOCUMENTS

| | | | | |
|---|---|---|---|---|
| 7,278,861 | B2 * | 10/2007 | Kishi et al. | 439/74 |
| 7,387,540 | B1 * | 6/2008 | Van der Steen | 439/660 |
| 7,465,171 | B2 * | 12/2008 | Miyazaki et al. | 439/74 |
| 7,497,697 | B2 * | 3/2009 | Hoshino et al. | 439/74 |
| 7,568,919 | B2 * | 8/2009 | Hoshino et al. | 439/74 |
| 7,637,786 | B2 * | 12/2009 | Hoshino et al. | 439/660 |
| 7,722,408 | B2 * | 5/2010 | Miyazaki et al. | 439/660 |
| 7,744,377 | B2 * | 6/2010 | Wu et al. | 439/74 |
| 2007/0141866 | A1 * | 6/2007 | Kishi et al. | 439/74 |
| 2007/0141867 | A1 * | 6/2007 | Kishi et al. | 439/74 |
| 2009/0061655 | A1 * | 3/2009 | Miyazaki et al. | 439/74 |
| 2009/0176386 | A1 * | 7/2009 | Wu | 439/74 |

FOREIGN PATENT DOCUMENTS

JP 2005-203139 A 7/2005

* cited by examiner

*Primary Examiner* — Hae Moon Hyeon

(74) *Attorney, Agent, or Firm* — Holtz, Holtz, Goodman & Chick, PC

(57) ABSTRACT

A connector unit which is capable of suppressing lowering of a clicking feeling, even if the fitting and removing of connectors to and from each other is repeated. A spring portion that receives a contact portion of each of plug contacts of a plug connector when a receptacle connector and the plug connector are fitted to each other is formed on each of receptacle contacts of the receptacle connector. A protrusion is formed on the contact portion of each plug contact. The spring portion is formed to have an auxiliary contact portion that is urged by the protrusion when both of the connectors are fitted to each other, and a recess that receives the protrusion when the both of the connectors are fitted to each other.

16 Claims, 17 Drawing Sheets

CONNECTOR UNIT WITH A CLICKING FEELING

BACKGROUND OF THE INVENTION

1. Field of the Invention

This invention relates to a connector unit, and more particularly to a connector unit in which a clicking feeling can be sensed when connectors are fitted to each other.

2. Description of the Related Art

Conventionally, there has been proposed a connector unit in which a clicking feeling can be sensed when connectors (a socket and a header) are fitted to each other (see Japanese Laid-Open Patent Publication (Kokai) No. 2005-203139).

This connector unit is comprised of a socket as one connector and a header as the other connector which can be fitted to the socket.

Each of contacts held by the socket is formed with an engaging step portion, and each of contacts held by the header is formed with an engaging protruding portion associated with the aforementioned engaging step portion.

When the socket and the header are fitted, the engaging step portion and the engaging protruding portion are engaged, whereby a clicking feeling is generated.

Both of the socked-side contacts each having the engaging step portion and the header-side contacts each having the engaging protruding portion are made of metal, and by repeating the fitting and removing of the socket and the header to and from each other, the engaging step portion and the engaging protruding portion become worn, which makes a clicking feeling poor (weak).

SUMMARY OF THE INVENTION

The present invention has been made in view of these circumstances, and an object thereof is to provide a connector unit which is capable of suppressing lowering of a clicking feeling, even if the fitting and removing connectors to and from each other is repeated.

To attain the above object, the present invention provides a connector unit comprising a first connector that is mounted on a first object to be connected, the first connector including first contacts, and a first housing that holds the first contacts, and a second connector that can be fitted to the first connector, and is mounted on a second object to be connected, the second connector including at least one second contact, and a second housing that holds the second contact, wherein the second contact includes a second holding portion which is held by the second housing, and a second contact portion which is continuous with the second holding portion, wherein the first contact includes a first holding portion that is held by the first housing, a first spring portion that is continuous with the first holding portion and receives the second contact portion when the first and second connectors are fitted to each other, and a first contact portion that is continuous with the first spring portion and is brought into contact with the second contact portion when the first and second connectors are fitted to each other, wherein the second connector includes a pressing portion that presses the first spring portion against a restoring force thereof when fitting of the first and second connectors to each other is started, to thereby push the first spring portion into the first object to be connected, wherein the first spring portion includes a pressed portion that is pressed by the pressing portion when the fitting of the first and second connectors to each other is started, a pressing portion-receiving portion that receives the pressing portion before completion of the fitting of the first and second connectors to each other, to thereby release pressing of the pressing portion against the first spring portion, and a connecting portion that connects between the pressing portion-receiving portion and the first contact portion, and wherein when the pressed portion is pressed by the pressing portion, at least part of the connecting portion is brought into abutment with the first object to be connected, and when the pressing of the pressing portion is released, the first spring portion moves to thereby release the abutment between the first object to be connected and the at least part of the connecting portion.

With the arrangement of the connector unit according to the first aspect of the present invention, when the pressing portion-receiving portion of the first spring portion of the first connector receives the associated pressing portion of the second connector to thereby release the pressing of the pressing portion against the pressed portion of the first spring portion, the abutment between the connecting portion and the first object to be connected is released, whereby the first spring portion moves away from the first object to be connected, so that a clicking feeling is generated when the first spring portion performs a return motion.

Preferably, a distance from a portion of the pressing portion-receiving portion, which is the closest therein to the first object to be connected, to the first object to be connected is larger than a distance from a portion of the connecting portion, which is the closest therein to the first object to be connected, to the first object to be connected.

Preferably, the first spring portion is substantially arc-shaped.

Preferably, the second contact includes an extended contact portion that is brought into contact with the pressed portion when the fitting the first and second connectors to each other is completed.

Preferably, the first housing includes an accommodating portion that accommodates the first spring portion, and permits a return motion of the first spring portion when the pressing of the pressing portion against the first spring portion is released, to thereby cause the first spring portion to move away from the first object to be connected, the accommodating portion extending through the first housing in a fitting/removing direction of the connectors to and from each other.

Preferably, the pressing portion is integrally formed on the second contact portion.

Preferably, the pressing portion is integrally formed on the second housing.

Preferably, the pressing portion is a metallic member that is disposed on the second housing.

Preferably, the pressing portion is a protrusion, and the pressing portion-receiving portion is arch-shaped.

According to this invention, it is possible to suppress lowering of a clicking feeling, even if the fitting and removing of the connectors to and from each other is repeated.

The above and other objects, features and advantages of the present invention will become more apparent from the following detailed description taken in conjunction with the accompanying drawings.

DETAILED DESCRIPTION OF THE PREFERRED EMBODIMENTS

The present invention will now be described in detail with reference to the drawings showing preferred embodiments thereof.

Figure 1:
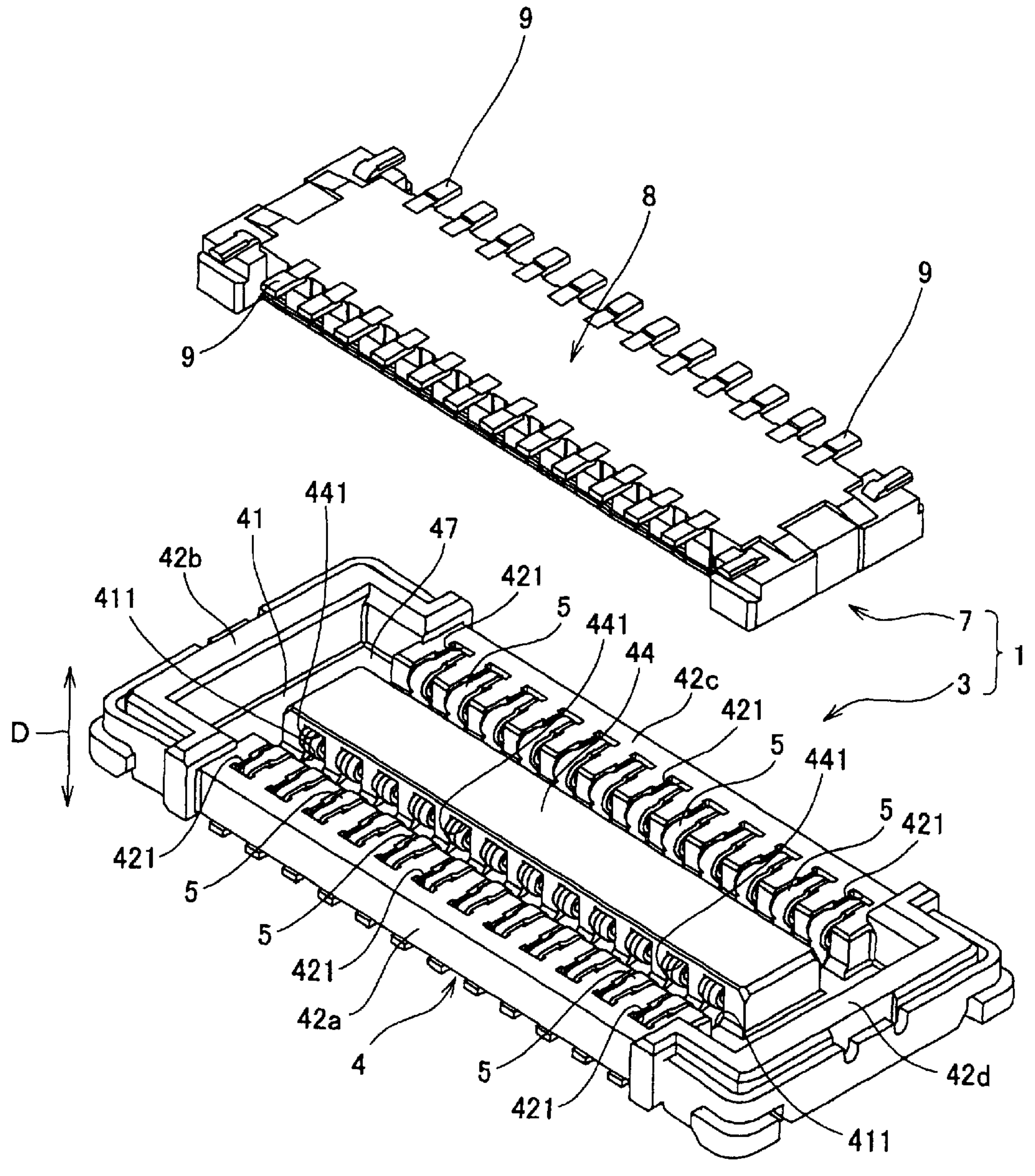
FIG. 1 is a perspective view of a connector unit according to a first embodiment of the present invention in a state in which a receptacle connector and a plug connector are separate from each other.

Referring to FIG. 1, a connector unit 1 of a first embodiment of the present invention is comprised of a receptacle connector 3, and a plug connector 7.

Figure 2:
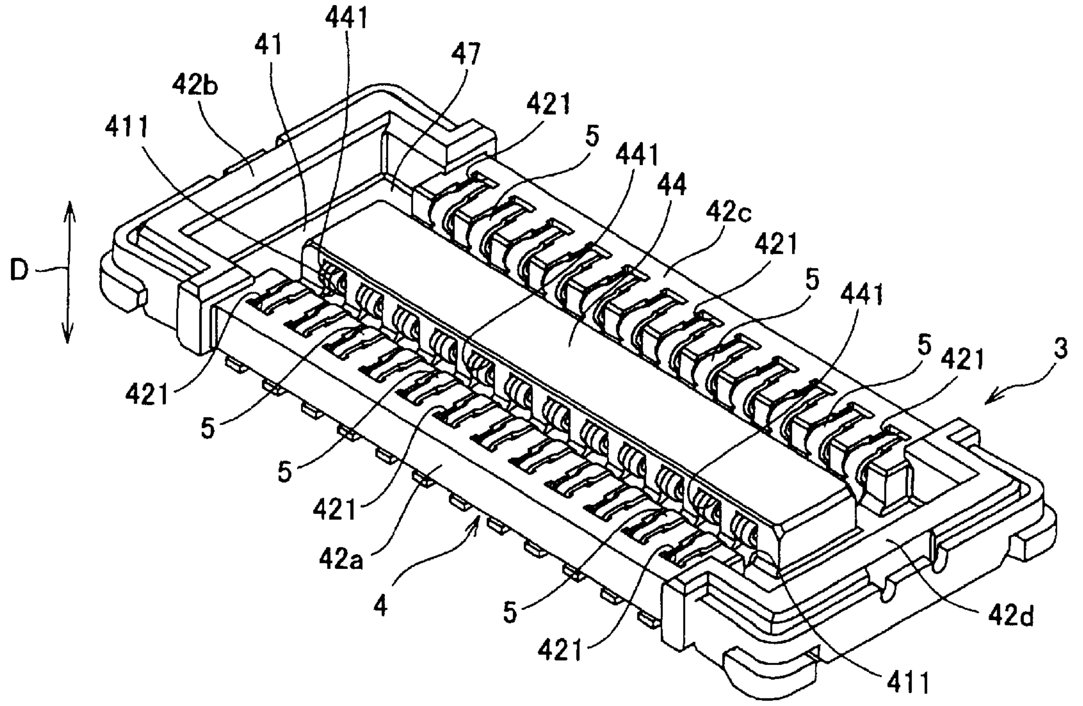
FIG. 2 is a perspective view of the receptacle connector appearing in FIG. 1.

As shown in FIGS. 1 and 2, the receptacle connector 3 includes a receptacle housing 4, and receptacle contacts 5. The receptacle connector 3 is mounted on a printed circuit board (first object to be connected) 21 (see FIG. 7).

The receptacle housing 4 is substantially tray-shaped, and includes a bottom board portion 41, wall portions 42*a*, 42*b*, 42*c*, and 42*d*, and a fitting projecting portion 44. The receptacle housing 4 is integrally molded from e.g. a synthetic resin.

The bottom board portion 41 has a substantially rectangle shape. A plurality of holes 411 are formed at equally-spaced intervals in two rows in the bottom board portion 41. Each of the holes 411 has a rectangle shape.

The wall portions 42*a*, 42*b*, 42*c*, and 42*d* are continuously formed along the four sides of the bottom board portion 41. A plurality of grooves 421 are formed at equally-spaced intervals in each of the wall portions 42*a* and 42*c* which are parallel to each other. The grooves 421 extend in a fitting/removing direction D of the plug connector 7 to and from the receptacle connector 3, and communicate with the holes 411.

The fitting projecting portion 44 has a substantially rectangular parallelepiped shape, and is formed on a central portion of the bottom board portion 41. A plurality of grooves 441 are formed at equally-spaced intervals in each of the two surfaces of the fitting projecting portion 44, which are opposed to the wall portions 42*a* and 42*c*. The grooves 441 communicate with the holes 411.

The fitting projecting portion 44 is surrounded by the wall portions 42*a*, 42*b*, 42*c*, and 42*d*, and a space 47 for inserting a plug housing 8 is formed between the fitting projecting portion 44, and the wall portions 42*a*, 42*b*, 42*c*, and 42*d*. A recess comprising the space 47 (particularly a space between the fitting projecting portion 44, and the wall portions 42*a* and 42*c*), the grooves 441, and the holes 411 corresponds to an accommodating portion defined in a preferred embodiment of the present invention. This accommodating portion is a space formed in the receptacle housing 4, for accommodating spring portions 52 (first spring portion), which permits a return motion of the spring portions 52 when the pressing of protrusions (pressing portion) 921 of plug contacts 9, referred to hereinafter, against the spring portions 52 is released, to thereby allow the spring portions 52 to move away from the print circuit board 21 (see FIG. 7). Therefore, the component elements of the accommodating space are not limited to the space 47, the grooves 441, and the holes 411.

Figure 3:
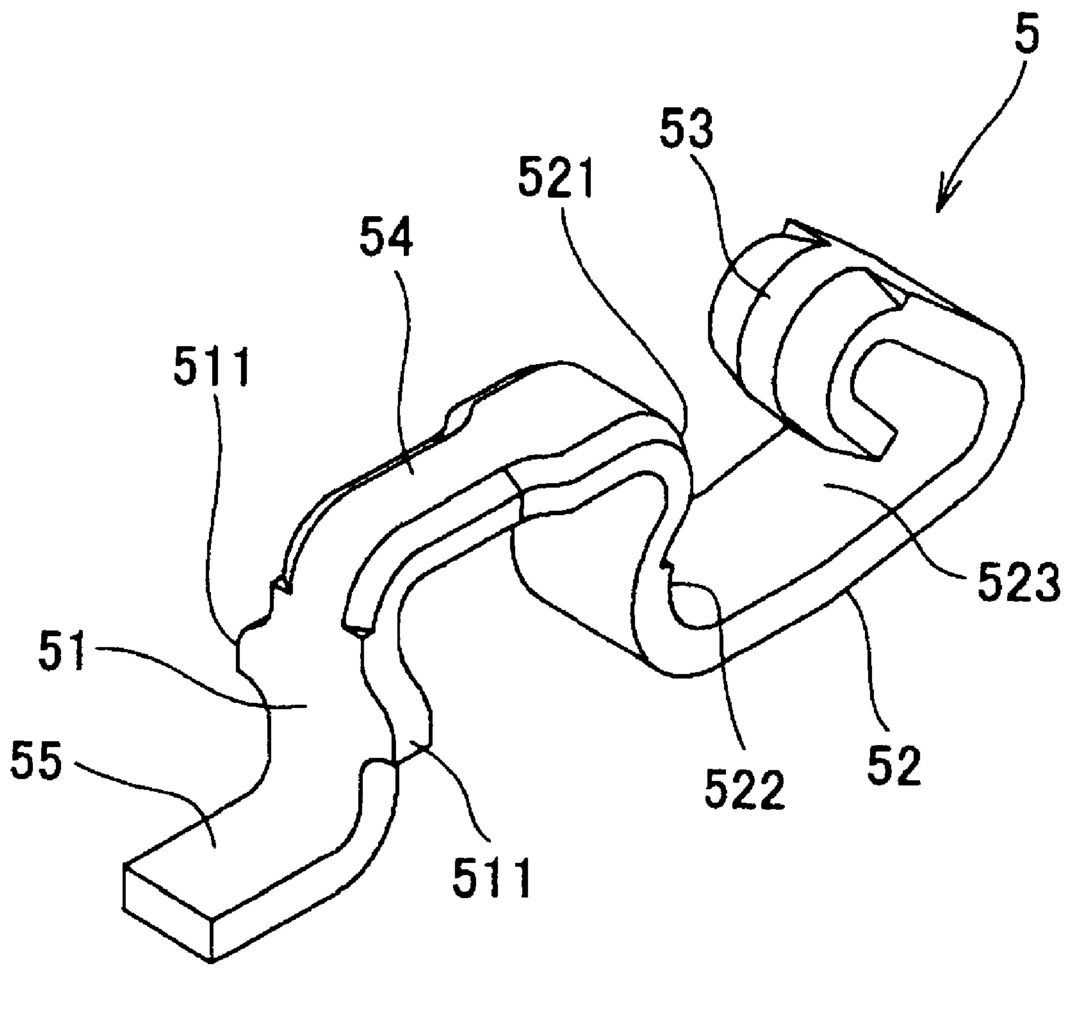
FIG. 3 is a perspective view of a receptacle contact of the receptacle connector shown in FIG. 2.
Figure 4:
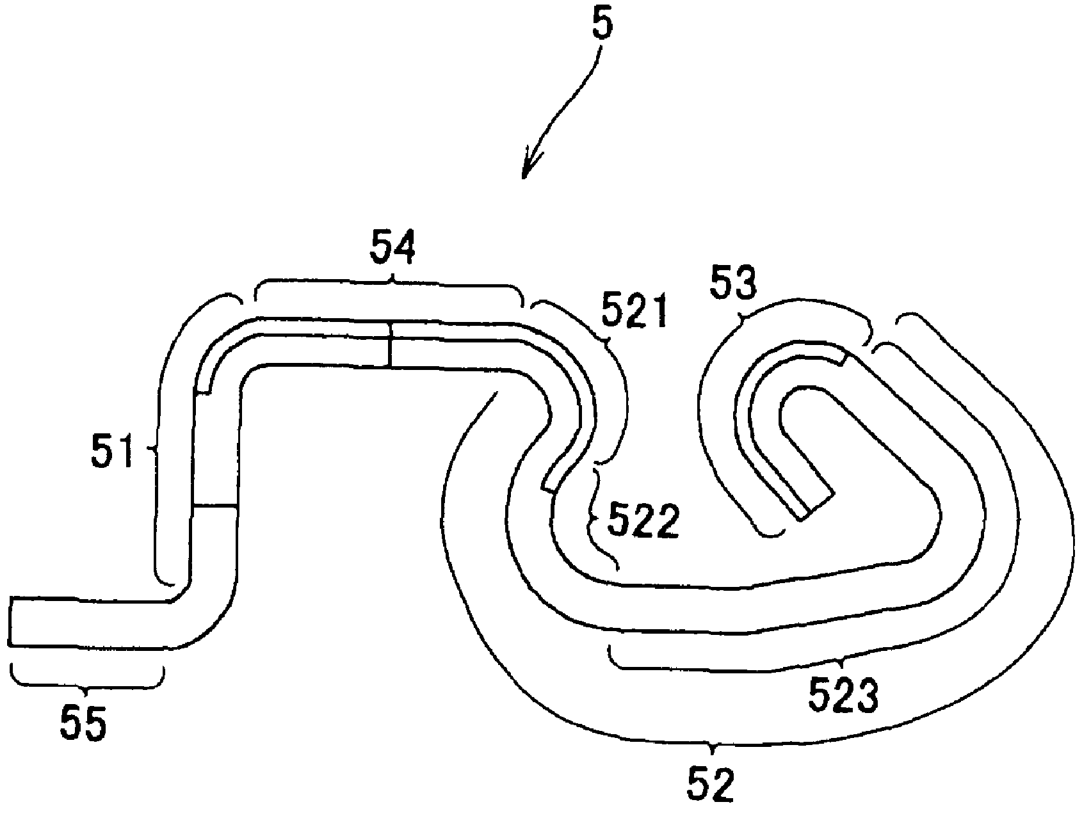
FIG. 4 is a side view of the receptacle contact shown in FIG. 3.

As shown in FIGS. 3 and 4, each of the receptacle contacts 5 includes a holding portion (first holding portion) 51, the spring portion 52, a contact portion (first contact portion) 53, a connecting portion 54, and a terminal portion 55. Each receptacle contact 5 is formed by blanking and bending a metal plate having conductivity and elasticity.

The holding portion 51 includes press-fitting protruding portions 511. The press-fitting protruding portions 511 are press-fitted in the grooves 421 of the receptacle housing 4. This holds the holding portion 51 in the receptacle housing 4.

The spring portion 52 is substantially arc-shaped, and is continuous with the holding portion 51 via the connecting portion 54. The spring portion 52 includes an auxiliary contact portion (pressed portion) 521, a recess (pressing portion-receiving portion) 522 which is arranged adjacent to the auxiliary contact portion 521 in the fitting/removing direction D, and a connecting portion 523. The auxiliary contact portion 521 is pressed by the protrusion 921 of the associated plug contact 9 of the plug connector 7, referred to hereinafter, when fitting of the connectors is started. The recess 522 is arch-shaped, and receives the associated protrusion 921 when the receptacle connector 3 and the plug connector 7 are fitted to each other. The connecting portion 523 connects between the recess 522 and the contact portion 53. When the receptacle connector 3 and the plug connector 7 are fitted to each other, part of the spring portion 52 can protrude from the bottom surface of the receptacle housing 4 through the associated hole 411 (see FIG. 7) of the bottom board portion 41 of the receptacle housing 4.

The contact portion 53 is continuous with the spring portion 52. The contact portion 53 is accommodated in the associated groove 441 of the fitting projecting portion 44 of the receptacle housing 4 in a manner movable in the fitting/removing direction D. The connecting portion 54 connects between the holding portion 51 and the spring portion 52. The terminal portion 55 is continuous with the holding portion 51. The terminal portion 55 is soldered to the printed circuit board (see FIG. 7).

Figure 5:
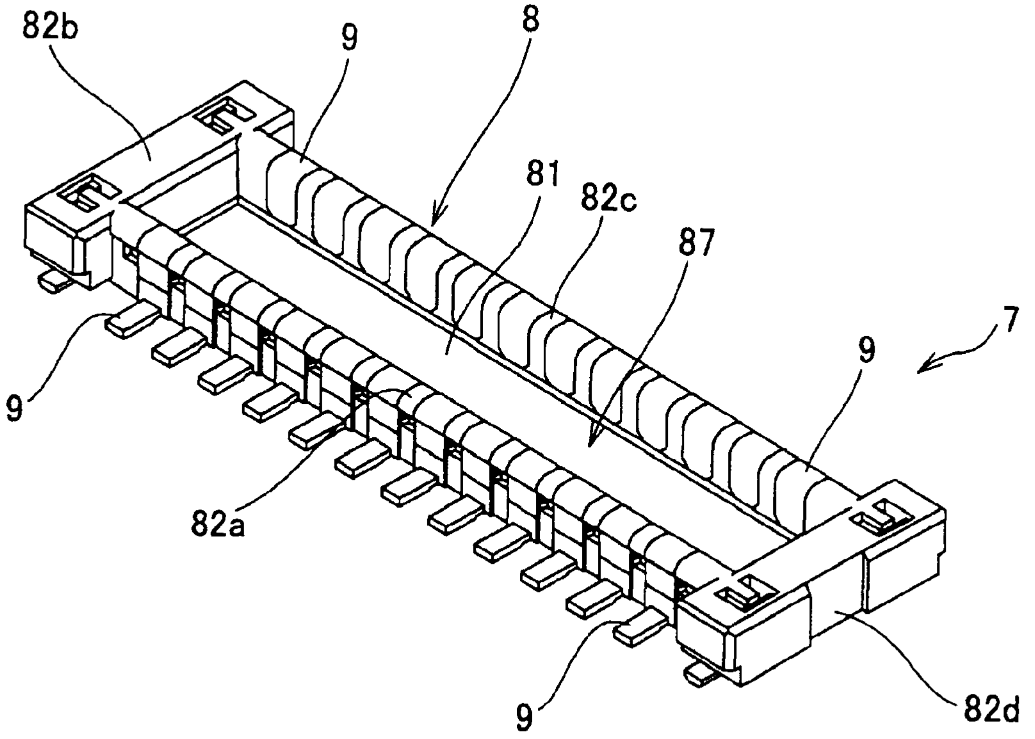
FIG. 5 is a perspective view of the plug connector appearing in FIG. 1 in which the plug connector is inverted upside down.

As shown in FIGS. 1 and 5, the plug connector 7 includes the plug housing 8 and the plug contacts 9. The plug connector 7 is mounted on a printed circuit board (second object to be connected) 22 (see FIG. 7).

The plug housing 8 is substantially tray-shaped, and includes a bottom board portion 81, wall portions 82*a*, 82*b*, 82*c*, and 82*d*. The plug housing 8 is integrally molded from e.g. a synthetic resin.

The bottom board portion 81 is substantially rectangle-shaped. The wall portions 82*a*, 82*b*, 82*c*, and 82*d* are continuously formed along the four sides of the bottom board portion 81.

Figure 6:
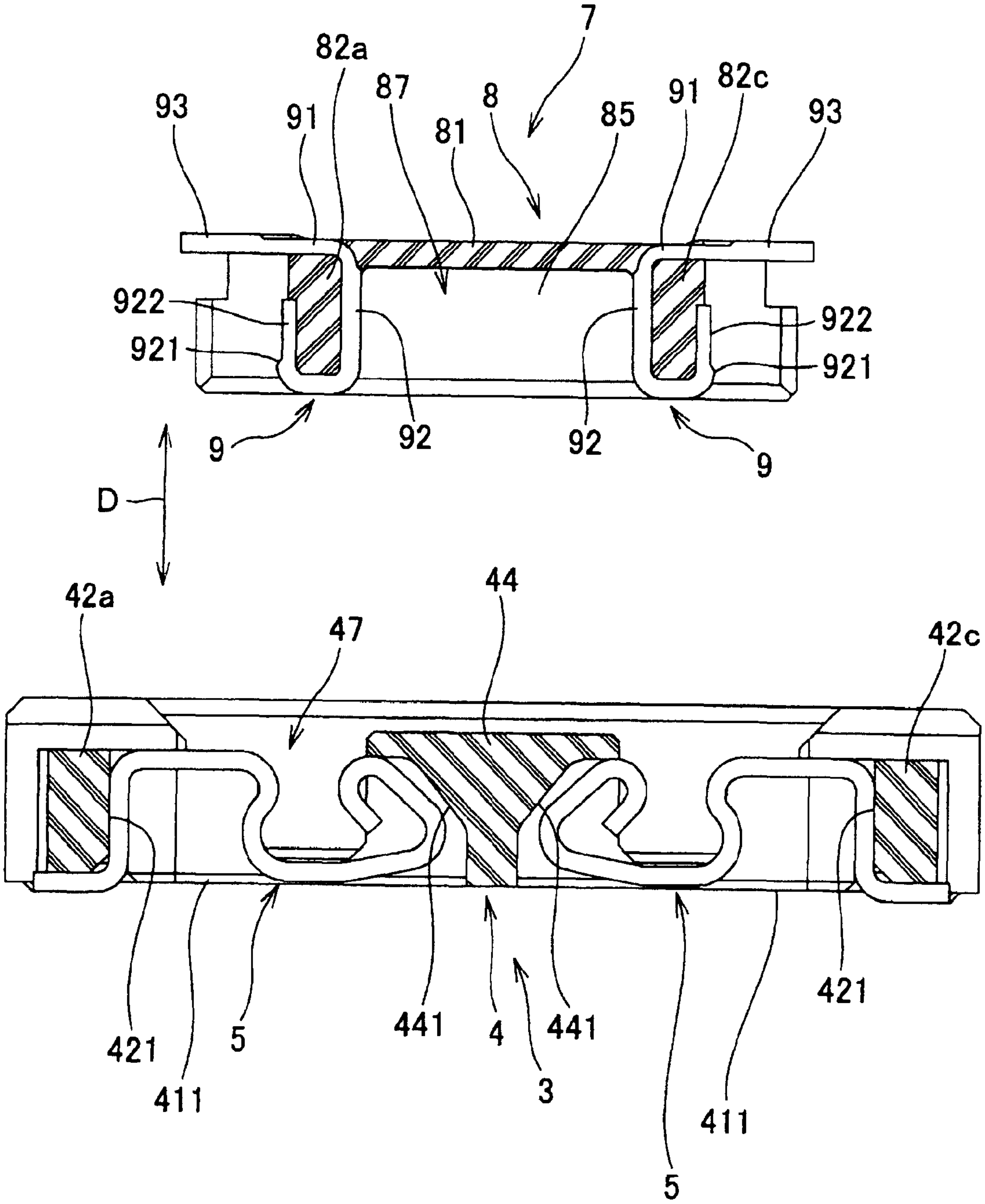
FIG. 6 is a cross-sectional view of the connector unit shown in FIG. 1 in a state in which the receptacle connector and the plug connector are separate from each other.
Figure 7:
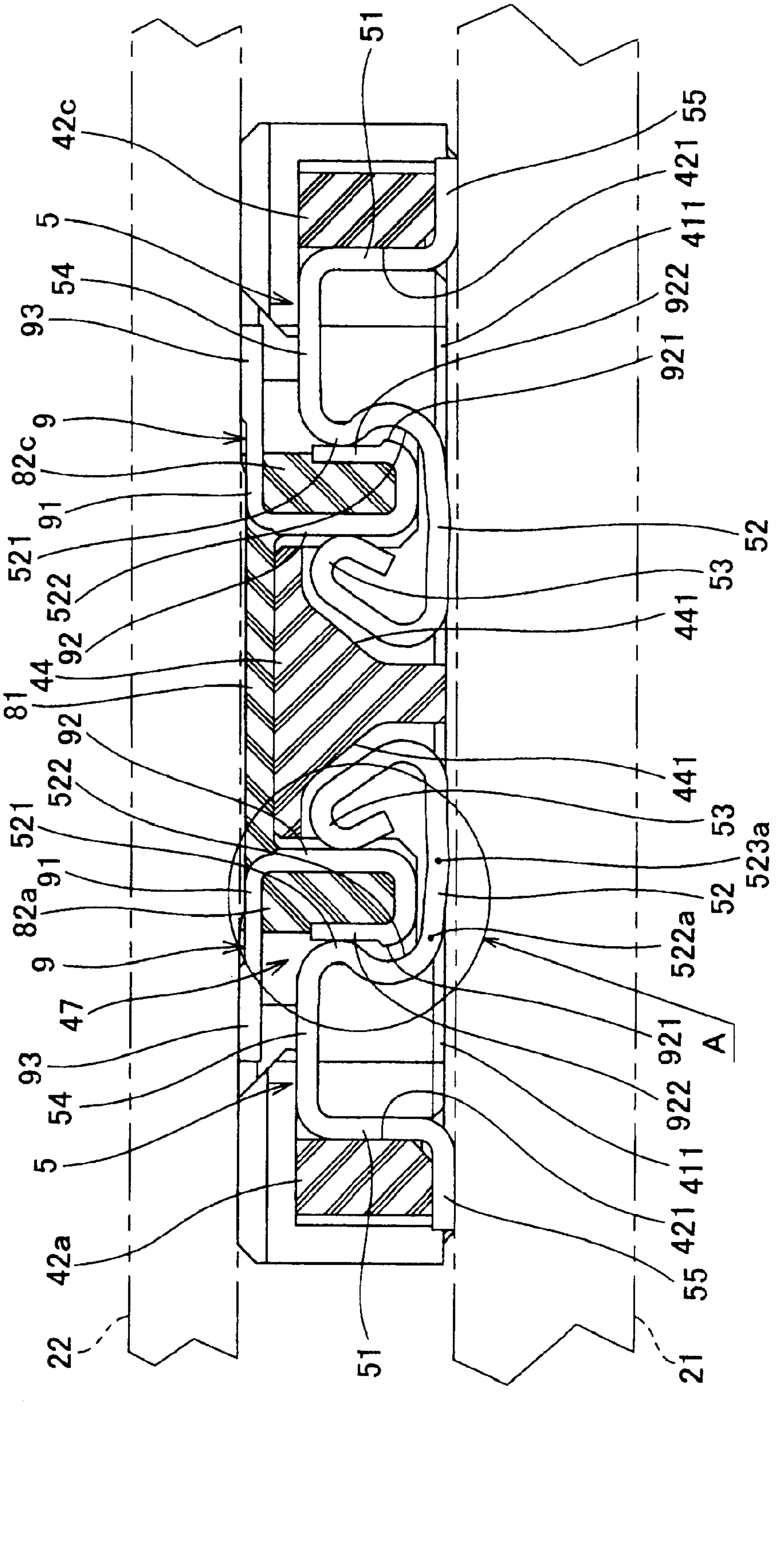
FIG. 7 is a cross-sectional view of the connector unit shown in FIG. 1 in a state in which the receptacle connector and the plug connector are fitted to each other.
Figure 8:
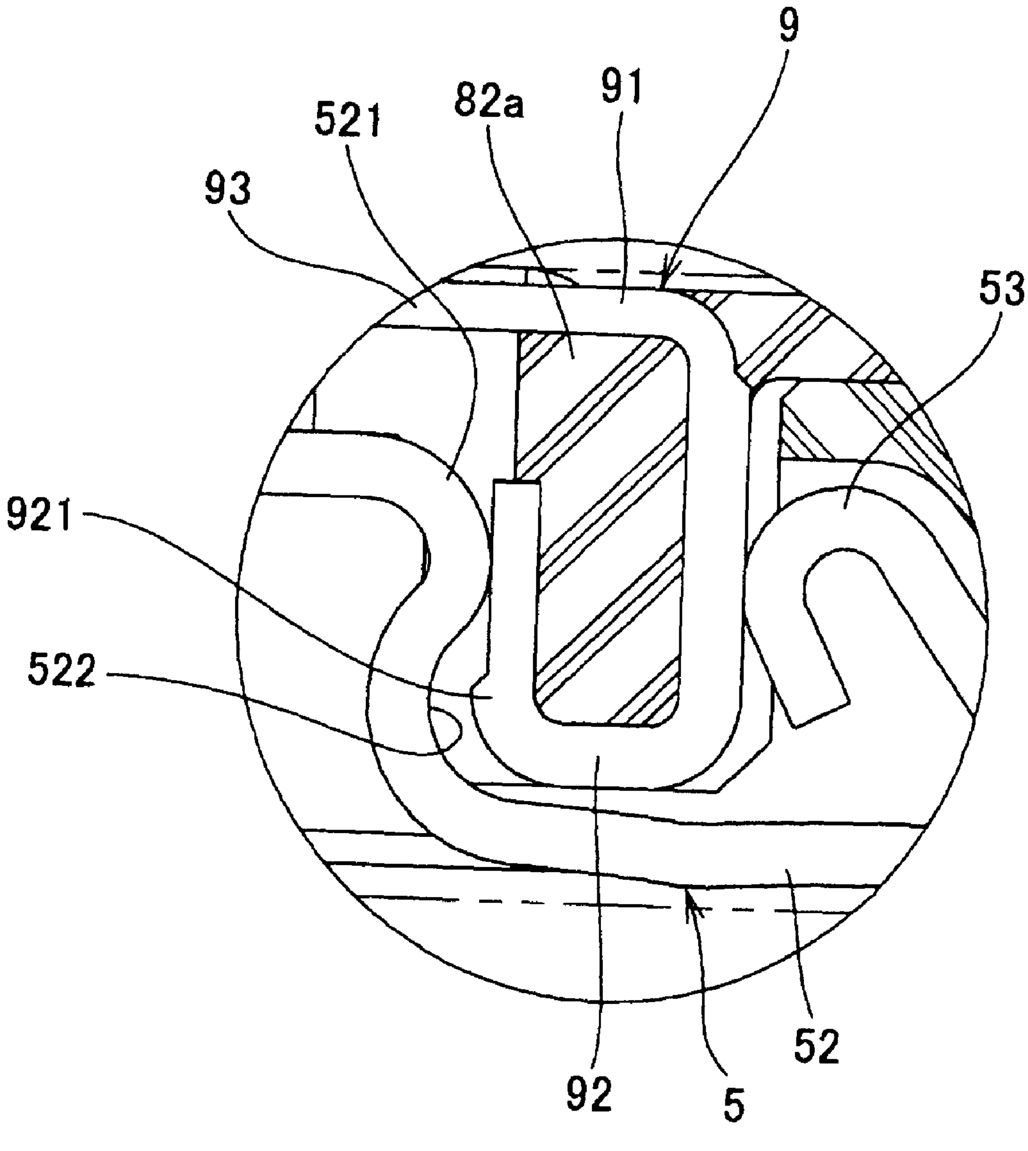
FIG. 8 is an enlarged view of part A in FIG. 7.
Figure 9:
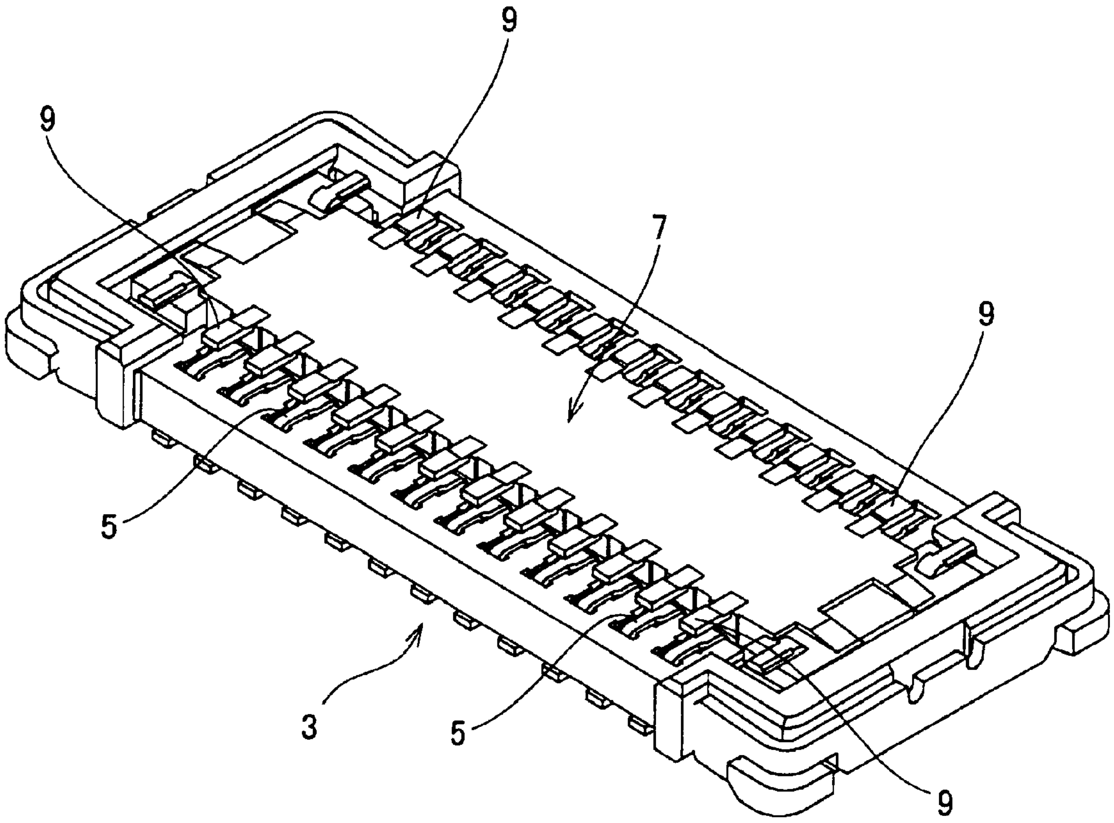
FIG. 9 is a perspective view of the connector unit shown in FIG. 1 in a state in which the receptacle connector and the plug connector are fitted to each other.

As shown in FIGS. 5, 6, and 7, each of the plug contacts 9 includes a holding portion (second holding portion) 91, a contact portion (second contact portion) 92, and a terminal portion 93. Each plug contact 9 is formed by blanking and bending a metal plate having conductivity and elasticity. Part of each plug contact 9 is embedded in the plug housing 8 by the so-called mold-in molding method.

The holding portion 91 is held by the plug housing 8.

The contact portion 92 is continuous with the holding portion 91. The contact portion 92 is substantially J-shaped, and is wound around an associated one of the wall portions 82*a* and 82*c* from the inner surface to the outer surface. The contact portion 92 includes the protrusion 921 and an extended contact portion 922 continuously extending from the protrusion 921. The protrusion 921 protrudes from the outer surface of each of the wall portions 82*a* and 82*c*. The extended contact portion 922 extends in the fitting/removing direction D, and is located on the outer surface of an associated one of the wall portions 82*a* and 82*c*. The extended contact portion 922 is brought into contact with the associated auxiliary contact portion 521 when the fitting of the receptacle connector 3 and the plug connector 7 is completed.

The terminal portion 93 is continuous with the holding portion 91. The terminal portion 93 is soldered to the printed circuit board 22 (see FIG. 7).

When the fitting of the receptacle connector 3 and the plug connector 7 is started, the protrusion 921 of each plug contact 9 is brought into contact with the auxiliary contact portion 521 of the associated receptacle contact 5 and thereby presses the auxiliary contact portion 521.

When the auxiliary contact portion 521 is pressed by the protrusion 921, the spring portion 52 is elastically deformed and is moved downward, whereby at least part of the connecting portion 523 is brought into abutment with the printed circuit board 21. When at least part of the connecting portion 523 is brought into abutment with the printed circuit board 21, the spring portion 52 becomes hard.

Thereafter, when the protrusion 921 of each plug contact 9 is received in the recess 522 after climbing over the auxiliary contact portion 521 of each associated receptacle contact 5, causing the pressing of the protrusion 921 against the auxiliary contact portion 521 to be released, the spring portion 52 is moved upward by the restoring force thereof. At this time, the spring portion 52 which is brought into abutment with the printed circuit board 21 is moved upward, whereby the abutment between the connecting portion 523 and the printed circuit board 21 is released. Since the spring portion 52 becomes hard when the protrusion 921 climbs over the auxiliary contact portion 521, the operator senses a clicking feeling, and also when the pressing of the protrusion 921 against the auxiliary contact portion 521 is released, permitting the spring portion 52 to move upward, the operator also senses a clicking feeling.

According to the present embodiment, a clicking feeling is generated not only when the pressing of the protrusion 921 against the auxiliary contact portion 521 is released, but also when the spring portion 52 is moved upward by the restoring force thereof upon completion of fitting the connectors 3 and 7 to each other (when the spring portion 52 in abutment with the printed circuit board 21 is moved upward, causing the abutment between the connecting portion 523 and the printed circuit board 21 to be released), so that even if the protrusion 921 and the auxiliary contact portion 521 become worn, the operator can sense a clicking feeling as long as the protrusion 921 can press the auxiliary contact portion 521. Therefore, this suppresses lowering of the clicking feeling, which can be caused by repeatedly fitting and removing the connectors 3 and 7 to and from each other.

Next, a description will be given of a connector unit 201 of a second embodiment of the present invention with reference to FIGS. 10, 11, 12, and 13.

Component parts identical to those of the connector unit according to the first embodiment are denoted by identical reference numerals, and detailed description thereof is omitted, while only main component parts different in construction from those of the first embodiment will be described hereinafter.

In the first embodiment, as shown in FIG. 7, the distance from a portion 522*a* of the recess 522 of the spring portion 52, which is the closest therein to the printed circuit board 21, to the printed circuit board 21, and the distance from a portion 523*a* of the connecting portion 523, which is the closest therein to the printed circuit board 21, to the printed circuit board 21 are substantially equal to each other.

Figure 10:
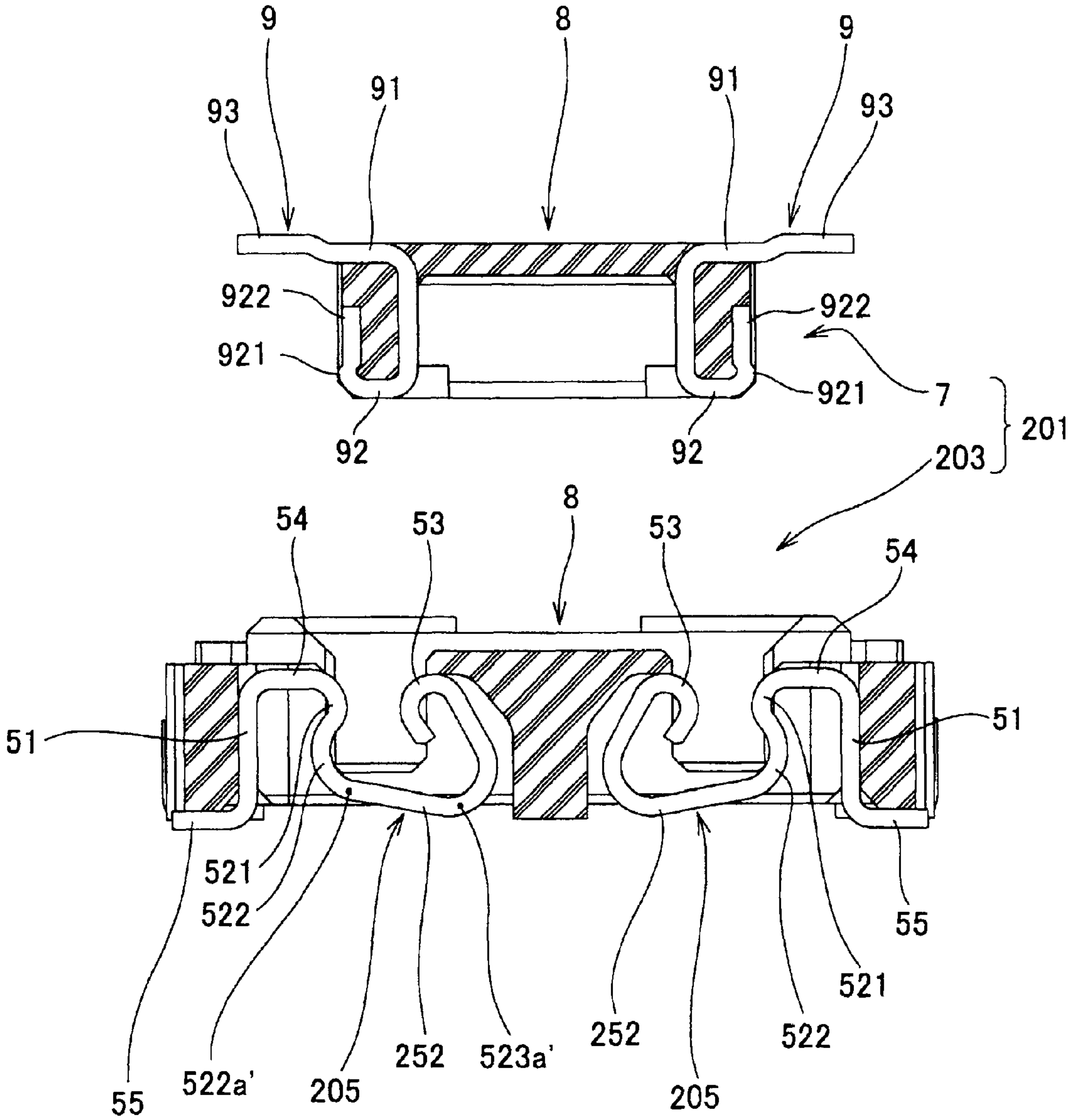
FIG. 10 is a cross-sectional view of a connector unit according to a second embodiment of the present invention in a state in which a receptacle connector and a plug connector are separate from each other.
Figure 11:
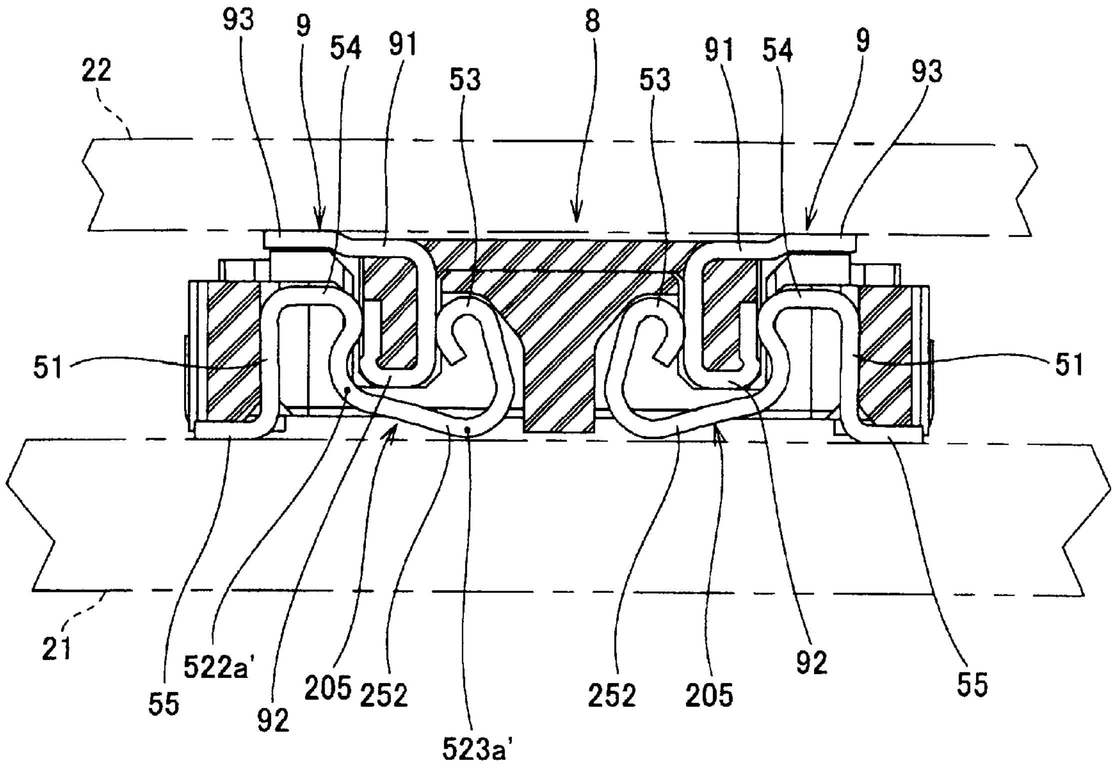
FIG. 11 is a cross-sectional view of the connector unit shown in FIG. 10 in a state in which the receptacle connector and the plug connector are fitted to each other.
Figure 12:
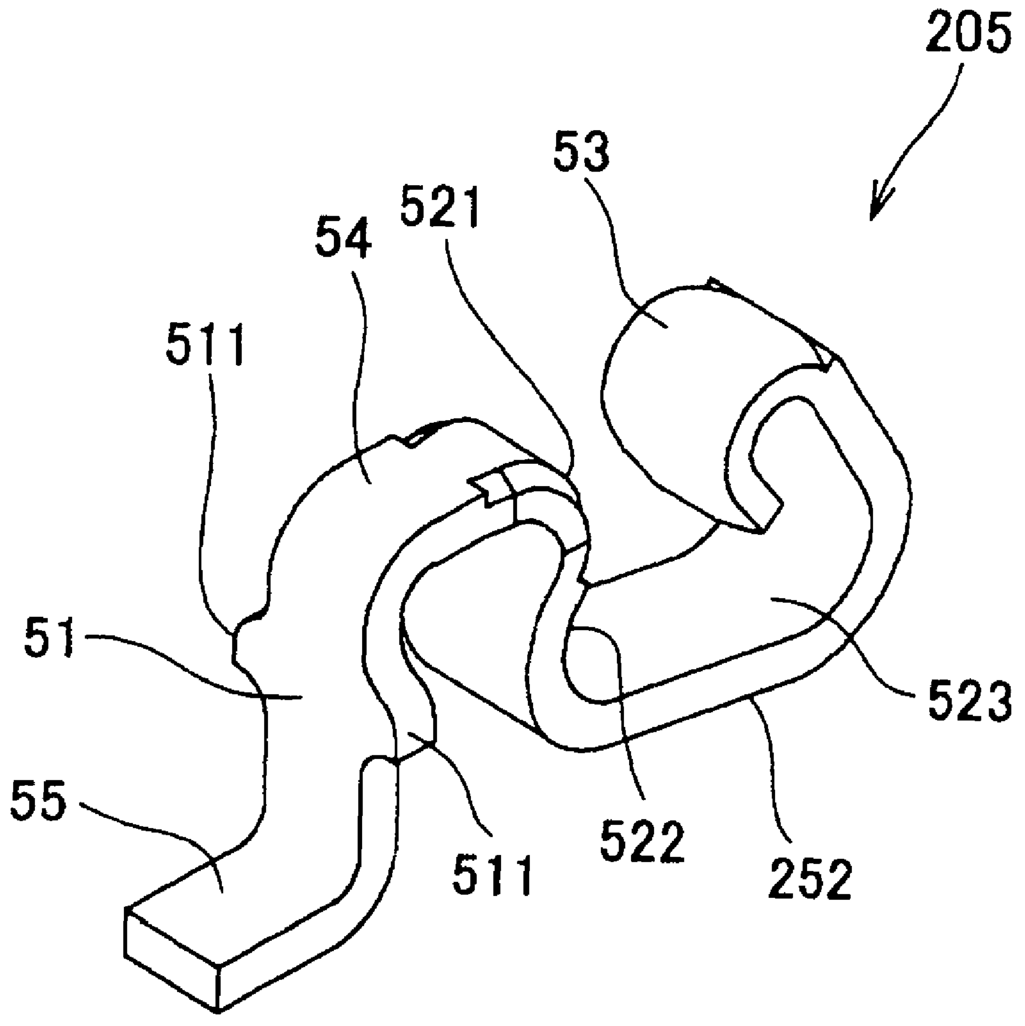
FIG. 12 is a perspective view of a receptacle contact of the receptacle connector of the connector unit shown in FIG. 10.
Figure 13:
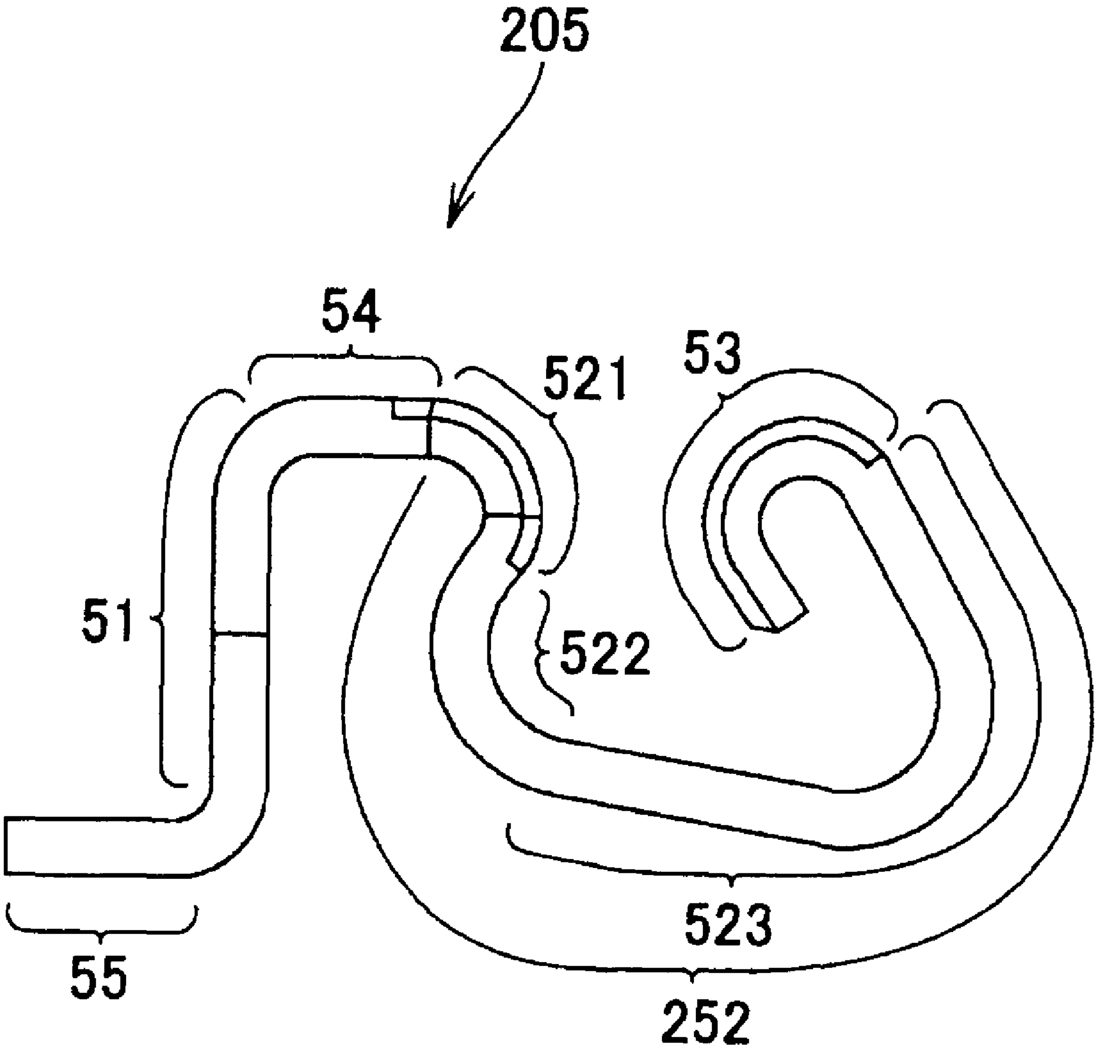
FIG. 13 is a side view of the receptacle contact shown in FIG. 12.

As distinct therefrom, in the second embodiment, as shown in FIGS. 10 and 11, the distance from a portion 522*a'* of the recess 522 of a spring portion 252 (first spring portion), which is the closest therein to the printed circuit board 21, to the printed circuit board 21, is larger than the distance from a portion 523*a'* of the connecting portion 523, which is the closest therein to the printed circuit board 21, to the printed circuit board 21.

In the first embodiment, a straight-line portion from the portion 522*a* to the portion 523*a* of each receptacle contact 5 of the receptacle connector 3 is substantially parallel to the mounting surface of the printed circuit board 21, whereas in the second embodiment, a straight-line portion from the portion 522*a'* to the portion 523*a'* of each receptacle contact (first contact) 205 of a receptacle connector (first connector) 203 is inclined with respect to the mounting surface of the printed circuit board 21.

According to the second embodiment, only the portion 523*a'* of each receptacle contact 205 is brought into abutment with the printed circuit board 21, whereby the abutment point between each receptacle contact 205 and the printed circuit board 21 is limited, so that this makes a clicking feeling clearer when the pressing of the protrusion 921 against the auxiliary contact portion 521 is released.

Figure 14:
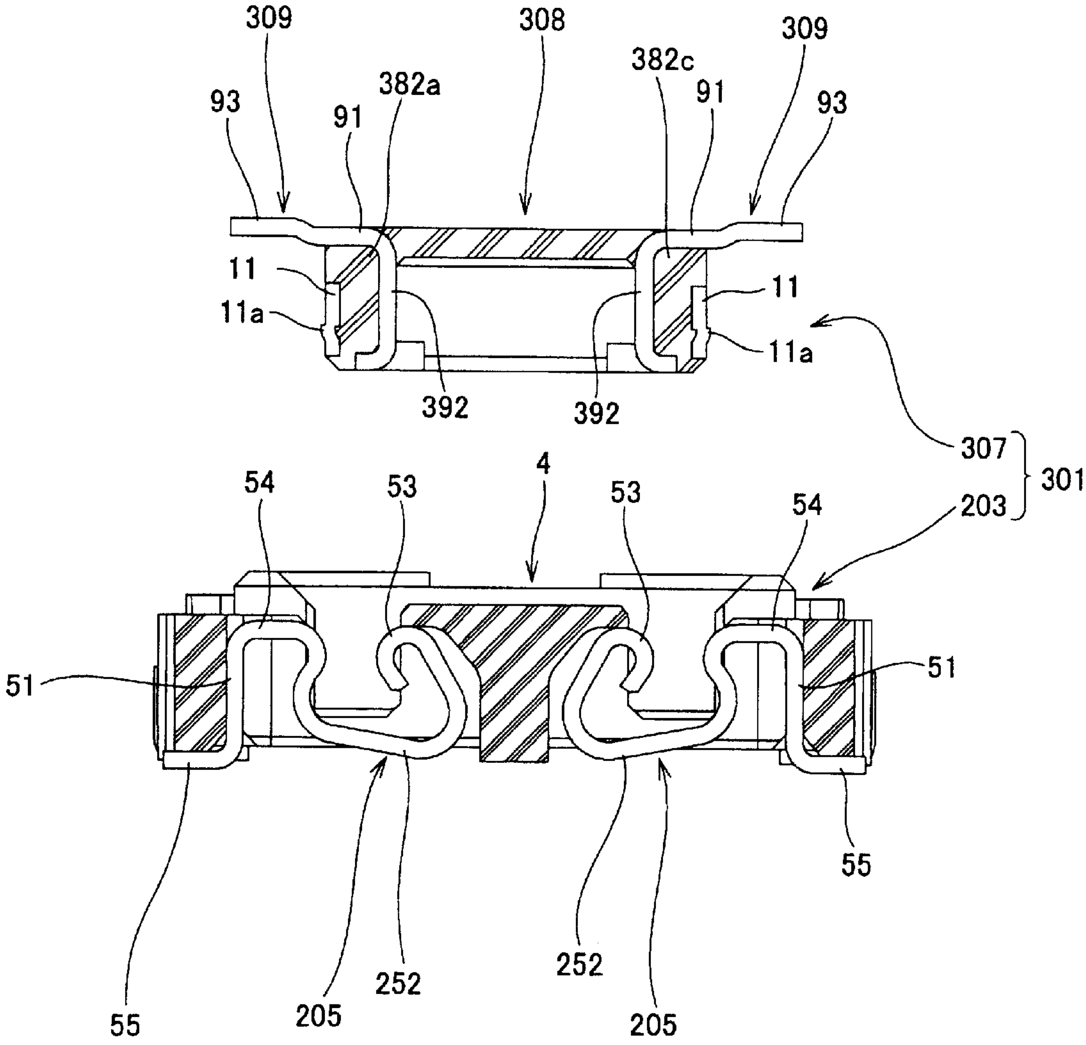
FIG. 14 is a cross-sectional view of a connector unit according to a third embodiment of the present invention in a state in which a receptacle connector and a plug connector are separate from each other.
Figure 15:
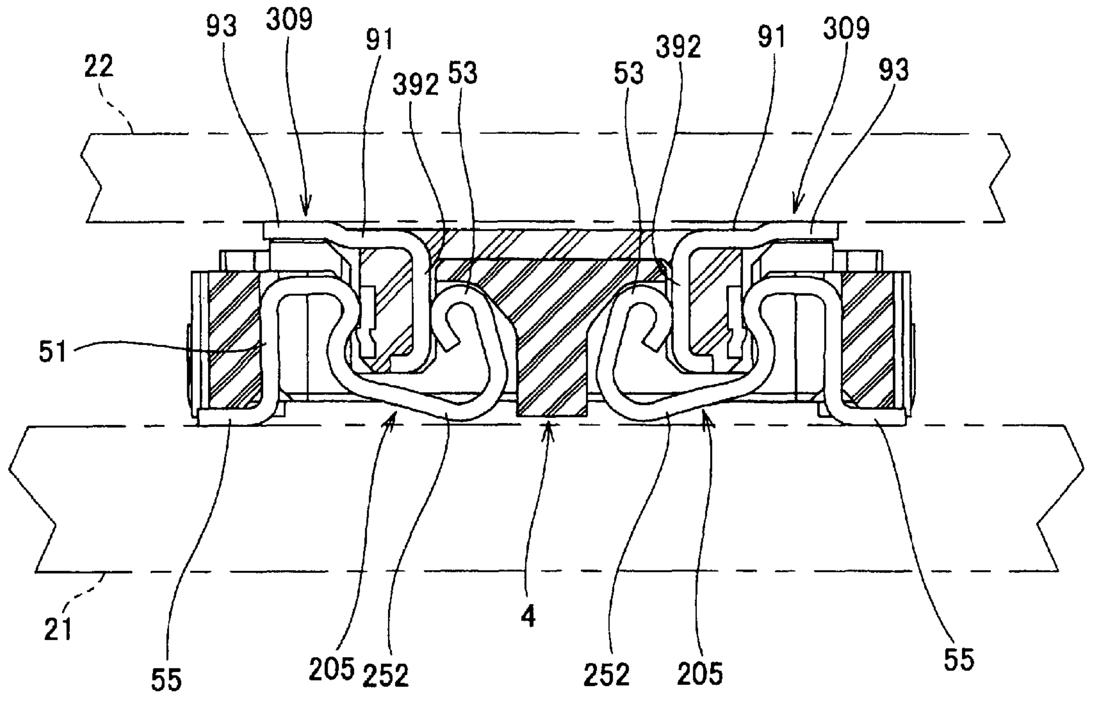
FIG. 15 is a cross-sectional view of the connector unit shown in FIG. 14 in a state in which the receptacle connector and the plug connector are fitted to each other.

Next, a description will be given of a connector unit 301 of a third embodiment of the present invention with reference to FIGS. 14 and 15.

Component parts identical to those of the connector unit according to the first and second embodiments are denoted by the same reference numerals, and detailed description thereof is omitted, while only main component parts different in construction from those of the first and second embodiments will be described hereinafter. It should be noted that the receptacle connector 203 of the connector unit 301 in the third embodiment is the same as the receptacle connector 203 of the connector unit 201 in the second embodiment.

Although in the first embodiment, the contact portion 92 of each plug contact 9 extends from the inner surface to the outer surface of the associated one of the wall portions 82_a_ and 82_c_, and includes the protrusion 921, in the third embodiment, a contact portion 392 of each of plug contacts (second contact) 309 of a plug connector (second connector) 307 does not extend to an outer surface of an associated one of wall portions 382_a_ and 382_c_ of a plug housing (second housing) 308. The contact portion 392 does not include a protrusion (pressing portion) and an extended contact portion. Instead, a metallic member 11 having a protrusion 11_a_ as a pressing portion is fixed to the outer surface of each of wall portions 382_a_ and 382_c_ of the plug housing 308. A function of the protrusion 11_a_ of the metallic member 11 is the same as that of the protrusion 921 of each plug contact 9 in the first and second embodiments.

According to the third embodiment, it is possible to obtain the same advantageous effects as provided by the first and second embodiments.

Figure 16:
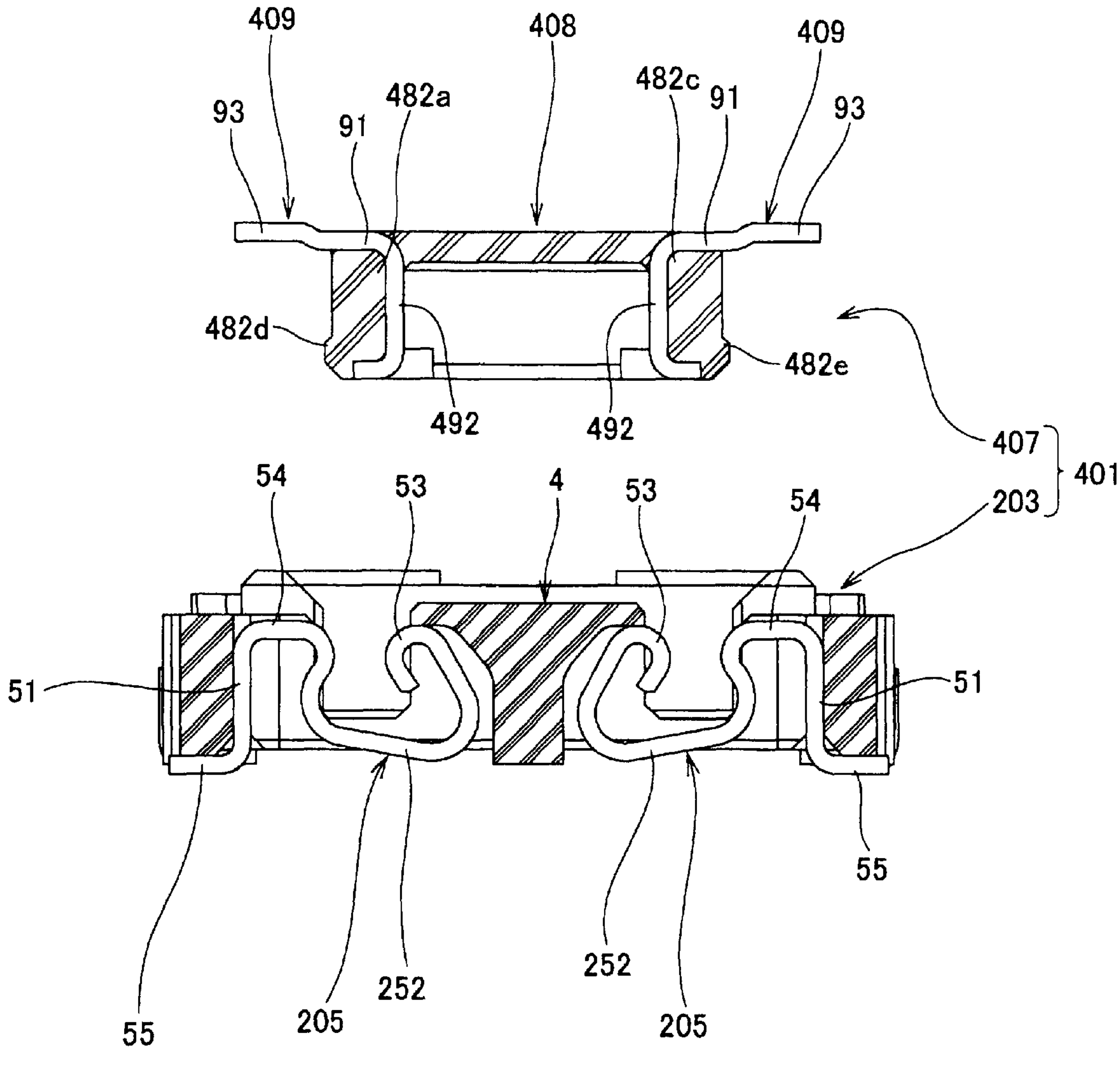
FIG. 16 is a cross-sectional view of a connector unit according to a fourth embodiment of the present invention in a state in which a receptacle connector and a plug connector are separate from each other.
Figure 17:
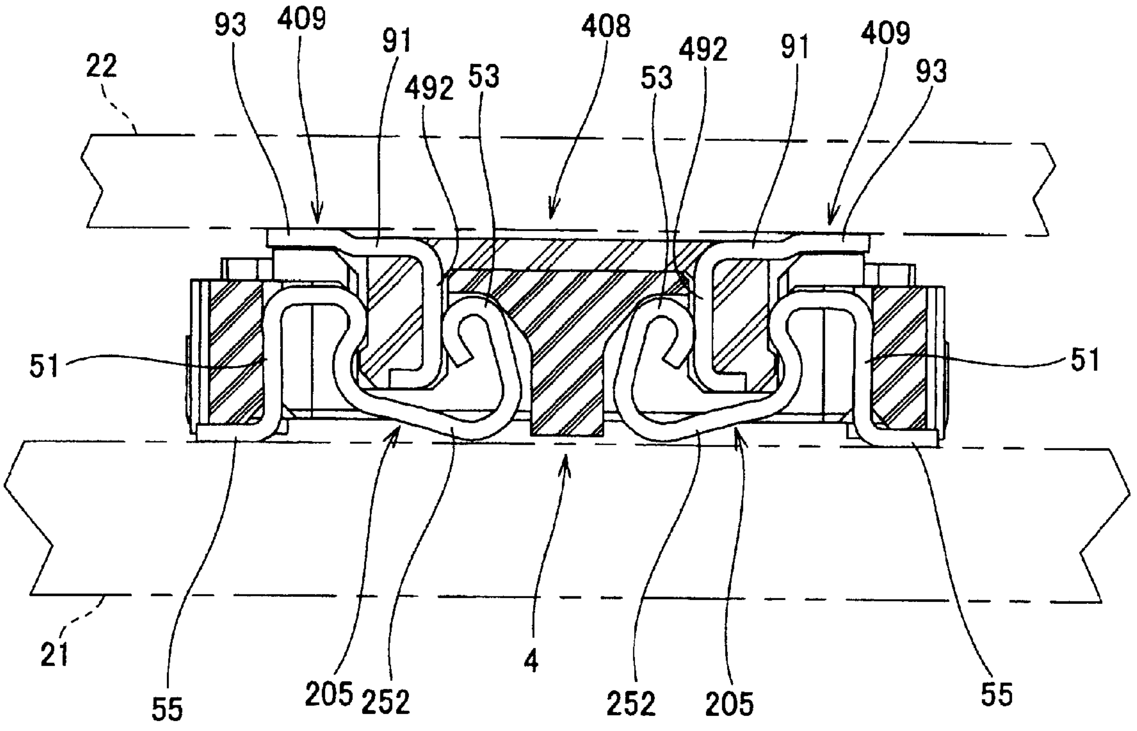
FIG. 17 is a cross-sectional view of the connector unit shown in FIG. 16 in a state in which the receptacle connector and the plug connector are fitted to each other.

Next, a description will be given of a connector unit 401 of a fourth embodiment of the present invention with reference to FIGS. 16 and 17.

Component parts identical to those of the connector unit according to the first and second embodiments are denoted by the same reference numerals, and detailed description thereof is omitted, while only main component parts different in construction from those of the first and second embodiments will be described hereinafter. It should be noted that the receptacle connector 203 of the connector unit 401 in the fourth embodiment is the same as the receptacle connector 203 of the connector unit 201 in the second embodiment.

Although in the first embodiment, the contact portion 92 of each plug contact 9 extends from the inner surface to the outer surface of each of the wall portions 82_a_ and 82_c_, and includes the protrusion 921, in the fourth embodiment, similarly to the third embodiment, a contact portion 492 of each of plug contacts 409 of a plug connector (second connector) 407 does not extend to an outer surface of each of wall portions 482_a_ and 482_c_ of a plug housing 408, and does not include a protrusion (pressing portion) and an extended contact portion. Instead, protrusions 482_d_ and 482_e_ as the pressing portions are formed on the respective outer surfaces of the wall portions 482_a_ and 482_c_ of the plug housing 408. The function of the protrusions 482_d_ and 482_e_ is the same as that of the protrusions 921 and 11_a_ of the respective plug contacts 9 in the first and third embodiments.

According to the fourth embodiment, it is possible to obtain the same advantageous effects as provided by the first, second, and third embodiments.

It should be noted that although in the above-described embodiment, the spring portions 52 and 252 are formed into substantially an arc shape, the shape of the spring portions 52 and 252 is not limited to the arc shape.

Further, although in the above-described embodiment, the pressing portions are the protrusions 921, 11_a_, 482_d_, and 482_e_, the pressing portions may be e.g. dome-shaped, or wedge-shaped.

It should be noted that although in the above-described embodiment, the recess 522 is arch-shaped, the shape of the recess 522 is not limited to the arch shape, for example, the recess 522 may be L-shaped or U-shaped.

Further, in the above-described embodiment, the receptacle housing 4 of the receptacle connector 3 or 203 is formed with the holes 411, so that the accommodating space for accommodating each spring portion 52 or 252 is provided as a through hole formed by the space 47, the associated groove 441, and the associated hole 411, thereby realizing reduction of the height of the accommodating space. However, the accommodating space is not required to be a through hole. For example, even if the holes are not formed in the bottom board portion of the receptacle housing, it is only necessary to bring at least part of each connecting portion 523 into abutment with the bottom board portion of the receptacle housing when the spring portion 52 or 252 is pressed, and it is only necessary to have a space in the receptacle housing as the accommodating space, which permits a return motion of the spring portion 52 or 252 by the restoring force thereof when the pressing of the protrusion 921, 482_d_, or 482_e_ against the associated spring portion 52 or 252 is released, to thereby permitting the spring portion 52 or 252 to move away from the printed circuit board 21.

It is further understood by those skilled in the art that the foregoing are the preferred embodiments of the present invention, and that various changes and modification may be made thereto without departing from the spirit and scope thereof.

What is claimed is:

1. A connector unit comprising:

a first connector that is mounted on a first object to be connected, said first connector including first contacts, and a first housing that holds said first contacts; and a second connector that can be fitted to said first connector, and is mounted on a second object to be connected, said second connector including at least one second contact, and a second housing that holds said second contact, wherein said second contact includes a second holding portion which is held by said second housing, and a second contact portion which is continuous with said second holding portion, wherein said first contact includes a first holding portion that is held by said first housing, a first spring portion that is continuous with said first holding portion and receives said second contact portion when said first and second connectors are fitted to each other, and a first contact portion that is continuous with said first spring portion and is brought into contact with said second contact portion when said first and second connectors are fitted to each other, wherein said second connector includes a pressing portion that presses said first spring portion against a restoring force thereof when fitting of said first and second connectors to each other is started, to thereby push said first spring portion into said first object to be connected, wherein said first spring portion includes a pressed portion that is pressed by said pressing portion when the fitting of said first and second connectors to each other is started, a pressing portion-receiving portion that receives said pressing portion before completion of the fitting of said first and second connectors to each other, to thereby release pressing of said pressing portion against said first spring portion, and a connecting portion that connects between said pressing portion-receiving portion and said first contact portion, and wherein when said pressed portion is pressed by said pressing portion, at least part of said connecting portion is brought into abutment with the first object to be connected, and when the pressing of said pressing portion is released, said first spring portion moves to thereby release the abutment between the first object to be connected and the at least part of said connecting portion.

2. The connector unit as claimed in claim 1, wherein a distance from a portion of said pressing portion-receiving portion, which is the closest therein to the first object to be connected, to the first object to be connected is larger than a distance from a portion of said connecting portion, which is the closest therein to the first object to be connected, to the first object to be connected.

3. The connector unit as claimed in claim 1, wherein said first spring portion is substantially arc-shaped.

4. The connector unit as claimed in claim 1, wherein said second contact includes an extended contact portion that is brought into contact with said pressed portion when the fitting of said first and second connectors to each other is completed.

5. The connector unit as claimed in claim 1, wherein said first housing includes an accommodating portion that accommodates said first spring portion, and permits a return motion of said first spring portion when the pressing of said pressing portion against said first spring portion is released, to thereby cause said first spring portion to move away from the first object to be connected, and wherein said accommodating portion extends through said first housing in a fitting/removing direction of said first and second connectors to and from each other.

6. The connector unit as claimed in claim 1, wherein said pressing portion is integrally formed on said second contact portion.

7. The connector unit as claimed in claim 1, wherein said pressing portion is integrally formed on said second housing.

8. The connector unit as claimed in claim 1, wherein said pressing portion is a metallic member that is disposed on the second housing.

9. The connector unit as claimed in claim 1, wherein said pressing portion is a protrusion, and said pressing portion-receiving portion is arch-shaped.

10. The connector unit as claimed in claim 2, wherein said first spring portion is substantially arc-shaped.

11. The connector unit as claimed in claim 2, wherein said second contact includes an extended contact portion that is brought into contact with said pressed portion when the fitting of said first and second connectors to each other is completed.

12. The connector unit as claimed in claim 2, wherein said first housing includes an accommodating portion that accommodates said first spring portion, and permits a return motion of said first spring portion when the pressing of said pressing portion against said first spring portion is released, to thereby cause said first spring portion to move away from the first object to be connected, and wherein said accommodating portion extends through said first housing in a fitting/removing direction of said connectors to and from each other.

13. The connector unit as claimed in claim 2, wherein said pressing portion is integrally formed on said second contact portion.

14. The connector unit as claimed in claim 2, wherein said pressing portion is integrally formed on said second housing.

15. The connector unit as claimed in claim 2, wherein said pressing portion is a metallic member that is disposed on the second housing.

16. The connector unit as claimed in claim 2, wherein said pressing portion is a protrusion, and said pressing portion-receiving portion is arch-shaped.

* * * * *